United States Patent [19]

Tamaki et al.

[11] Patent Number: 5,526,563
[45] Date of Patent: Jun. 18, 1996

[54] METHOD FOR MANUFACTURING AN ELECTRONIC COMPONENT

[75] Inventors: Tomohiro Tamaki; Kouichi Nagao; Hiroaki Fujimoto; Kazunari Nishihara, all of Osaka, Japan

[73] Assignee: Matsushita Electric Industrial Co., Ltd., Osaka, Japan

[21] Appl. No.: 401,258

[22] Filed: Mar. 9, 1995

[30] Foreign Application Priority Data

Mar. 10, 1994 [JP] Japan .................. 6-039756

[51] Int. Cl.⁶ ............................................ H05K 3/36
[52] U.S. Cl. .......................... 29/830; 359/82; 359/88
[58] Field of Search .................. 359/88, 82; 29/825, 29/830, 845; 174/260

[56] References Cited

U.S. PATENT DOCUMENTS

| | | |
|---|---|---|
| 4,346,516 | 8/1982 | Yokouchi et al. . |
| 4,431,270 | 2/1984 | Funada et al. ............... 359/88 X |
| 4,654,965 | 4/1987 | Uehara . |
| 4,964,700 | 10/1990 | Takabayashi ................. 359/88 |
| 5,311,341 | 5/1994 | Hirai .............................. 359/88 |
| 5,317,438 | 5/1994 | Suzuki et al. . |

FOREIGN PATENT DOCUMENTS

| | | | |
|---|---|---|---|
| 60-129729 | 7/1985 | Japan | ............. 359/88 |
| 60-225120 | 11/1985 | Japan | ............. 359/88 |
| 2-268451 | 11/1990 | Japan . | |
| 3-184023 | 8/1991 | Japan | ............. 359/88 |
| 4-82240 | 3/1992 | Japan . | |
| 5-265019 | 10/1993 | Japan | ............. 359/88 |

*Primary Examiner*—Carl J. Arbes
*Attorney, Agent, or Firm*—Willian Brinks Hofer Gilson & Lione

[57] ABSTRACT

A flexible wiring board is constructed by placing, on a surface of a flexible ultraviolet-transmissive base member in the form of a layer, a conductive member in the form of a layer and a covering member in the form of a layer. The conductive member has an exposed leading area not covered with the covering member. A lead is aligned with an electrode and they are connected together with pressure exerted by a pressure applying jig which is ultraviolet-transmissive. A photosetting adhesive resin capable of shrinking in volume is injected between the flexible wiring board and a printed circuit board. The photosetting adhesive resin is irradiated with ultraviolet passing through the pressure applying jig and the base member. When irradiated with the ultraviolet rays, the photosetting adhesive resin hardens. Volume shrinkage force exerted by the photosetting adhesive resin enhances the connection between the lead and the electrode. Such a connecting procedure can be performed at room temperature thereby cutting down the cost of the flexible board and providing a wider range of applications thereof.

18 Claims, 13 Drawing Sheets

5,526,563

METHOD FOR MANUFACTURING AN ELECTRONIC COMPONENT

BACKGROUND OF THE INVENTION

This invention relates to a method for connecting a conductive member formed on a board (e.g., a flexible wiring board and a glass board) and an electrode of an electronic component mounted on a board (e.g., a printed. circuit board).

Recently, not only household electric appliances but also apparatus for industrial use have been made compact in size, which is realized by mounting a great number of electronic components on a single board.

There are various means known in the art for connecting electrodes of different boards, such as soldering, conductive rubber connecting, and welding with pressure (hereinafter called the pressure welding) making use of an anisotropic conductive sheet.

A conventional connecting procedure of connecting a conductive member provided on a flexible wiring board and an electrode of an electronic component mounted on a printed circuit board will be described below. In such a conventional connecting procedure, a soldering process and a pressure welding process employing an anisotropic conductive sheet are used.

FIG. 13 cross-sectionally illustrates a conventional way of connecting a conductive member provided on a flexible wiring board with an electrode of an electronic component mounted on a printed circuit board by means of a pressure welding process using a thermosetting resin capable of shrinking in volume. FIG. 14a relates to a soldering process. FIG. 14b relates to a pressure welding process using an anisotropic conductive sheet.

As shown in FIG. 13, a flexible wiring board 1 is constructed by a total of five layers. More specifically, a conductive member (not shown in the figure) is formed on a flexible base film 2 via a first adhesive layer 4a. Formed on an electrode via a second adhesive layer 4b is a cover film 3. An area of the flexible wiring board 1 not covered with the cover film 3 acts as a lead section (not shown in the figure). This lead section is aligned with an electrode of a printed circuit board 7. Then, the lead section and the electrode are pressure-welded together. Thereafter, a resin that is volume-shrinkable is injected between the flexible wiring board 1 and the printed circuit board 7, to form a thermosetting resin layer 9. The thermosetting resin layer 9 exerts a shrinkage force thereby enhancing the mechanical connection of the flexible wiring board 1 and the printed circuit board 7 as well as the electrical connection between electrodes.

In the soldering process (see FIG. 14a), a lead section 6 of the flexible wiring board 1 is aligned with an electrode 8 of the printed circuit board 7. Then, a joint layer 26 of solder is formed to mechanically connect the flexible wiring board 1 and the printed circuit board 7 and to electrically connect the lead section 6 and the electrode 8. Generally, the lead section 6 is formed by solderplated copper.

In the pressure welding process (see FIG. 14b), the lead 6 of the flexible wiring board 1 is aligned with the electrode 8 of the printed circuit board 7. Then, an anisotropic conductive sheet is provided between the boards. Pressure and heat is applied to the flexible wiring board 1. An adhesive layer 27 is formed to mechanically connect the flexible wiring board 1 and the printed circuit board 7. At the same time, the lead 6 and the electrode 8 are electrically connected together through a conductive particle 28 contained within the anisotropic conductive sheet.

Each of the above-described techniques, however, produces some problems.

In the connecting technique using volume shrinkage force exerted by a thermosetting resin, a heating process is required. This means that the flexible wiring board 1 must have resistance to application of heat. To make the flexible wiring board 1 heat-resistant, the cover film 2 and the base film 3 must be formed by polyimide which is an expensive material.

In the connecting technique by means of soldering, a step of removing a flux by washing is required. Additionally, lead is toxic to the human body and use of lead produces environmental problems. Further, soldering provides a poor connecting strength, so that the flexible wiring board 1 and the printed circuit board 7 cannot be connected together sufficiently. Furthermore, solder must be heated and the cost of material increases because of the above-described reason.

In the connecting technique using an anisotropic conductive sheet, a fillet with strong adhesion cannot be produced, since an anisotropic conductive sheet is supplied in the form of a sheet. This results in providing poor tear-off resistance between the adhesive layer 27 of the anisotropic conductive sheet and the flexible wiring board 1 (the printed circuit board 7). Therefore, the flexible wiring board 1 and the printed circuit board 7 are not connected together sufficiently. Additionally, the anisotropic conductive sheet must be heated and the cost of material increases because of the same reason as described above.

Japanese Patent Application, published under Pub. No. 4-82240, shows a technique. This technique is as follows. In a step of connecting electrodes of two boards, one of the boards is placed on a platform formed by an ultraviolet-transmissive material. Electrodes of the boards are aligned with each other. The other board is placed on the one board. A photosetting resin is injected between the boards. The injected photosetting resin is irradiated with UV from under the platform, to connect the two boards at room temperature. This prior art technique, however, has the problem that a lower of the two board must be formed by an ultraviolet-transmissive material. The range of applications is thus be limited.

SUMMARY OF THE INVENTION

Bearing in mind the above-described problems accompanied with the prior art techniques, the present invention was made. Accordingly it is a general object of the present invention to provide an improved method of manufacturing an electronic component. In accordance with the present invention, connection can be established by means of a photosetting adhesive resin at room temperature even if a board, which carries thereon an electrode to be connected with a conductive member provided on a flexible wiring board, is not ultraviolet-transmissive. The present method requires neither a step of removing a flux by washing nor use of lead. Additionally, the present method not only enhances the connection between boards but also provides a wider application range.

The present invention provides a first method of manufacturing an electronic component. In this first method, (a) a first flexible board is pre-formed by placing, onto a surface of a base member of an ultraviolet-transmissive flexible material, a conductive member in the form of a layer extending along the base member and a flexible covering member in the form of a layer with which a part of the conductive member is covered, (b) the first board has a body portion formed by the laminations of the base member, the conductive member, and the covering member, and a lead section that is an exposed part of the conductive member not covered with the covering member, and (c) the lead section of the first board is connected with an electrode of a second board having thereon a device. The first electronic-component manufacturing method comprises:

a first step of placing the second board on a platform, with a surface of the second board carrying thereon the electrode facing upwardly;

a second step of applying to at least one of the first board and the second board a photosetting adhesive resin that is volume-shrinkable;

a third step of aligning the lead section of the first board with the electrode of the second board and placing the first board on the second board;

a fourth step of applying a pressure to the first board by means of a pressuring applying jig of an ultraviolet-transmissive material which has an end face acting as a pressuring surface, to connect the lead section of the first board and the electrode of the second board by the applied pressure; and a fifth step of sending rays of ultraviolet to the photosetting adhesive resin via the pressure applying jig and the base member of the first board.

In the first electronic-component manufacturing method, both the pressure applying jig and the first board are ultraviolet-transmissive. This permits the photosetting adhesive resin to harden at room temperature even if the second board is not ultraviolet-transmissive. This accordingly provides a wider range of applications of the flexible wiring board. Further, the base member and the covering member of the first board acting as a flexible wiring board can be constructed with an inexpensive material. For example, instead of using polyimide which is expensive, polyester may be used.

In the first electronic-component manufacturing method, it is preferable that the second step is performed after the fourth step and the photosetting adhesive resin is applied to around the lead section of the first board and the electrode of the second board which have been connected together with the applied pressure in the second step.

In accordance with the above arrangement, since no photosetting adhesive resin is applied between the lead section and the electrode, there is no need to force out a photosetting adhesive resin. Therefore, even if press-welding force is low in the fourth step, this will not prevent the lead section and the electrode from being connected together electrically. Possible ill-influence to the second board and devices to be mounted on the second board can be avoided.

In the first electronic-component manufacturing method, it is preferable that the first board has a lead section that is already plastic-deformed by application of pressure so as to have uniform height from a surface of the base member.

In accordance with the above arrangement, even if pressuring force is low, this will not prevent the lead section and the electrode from being electrically connected together. Possible ill-influence to the second board and devices to be mounted on the second board can be avoided.

In the first electronic-component manufacturing method, it is preferable that in the fourth step at least one side face of the pressure applying jig and a direction of travel of ultraviolet through the pressure applying jig are tilted at almost the same angle with respect to a direction normal to the pressurizing surface of the pressure applying jig.

In accordance with the above arrangement, interference of devices, arranged above the platform onto which the second board is placed, with the pressure applying jig can be avoided. Additionally, the alignment of the lead section with the electrode can be inspected easily.

In the first electronic-component manufacturing method, it is preferable that the pressure applying jig used in the fourth step is formed by a bundle of optical fibers and each of the optical fibers has an end face acting as a pressurizing surface.

In accordance with the above arrangement, since damping in the intensity of ultraviolet passing through the pressure applying jig is considerably low, this allows rays of ultraviolet with a higher intensity to strike the photosetting adhesive resin. A period of time within which the photosetting adhesive resin hardens can be reduced thereby improving the productivity.

In the first electronic-component manufacturing method, to enhance the connection of the first board and the second board at the leading area of the lead section, it is preferable that in the fourth step at least one side face of the pressure applying Jig and a direction of travel of ultraviolet through the pressure applying jig are tilted at almost the same angle with respect to a direction normal to the pressurizing surface of the pressure applying jig.

In the first electronic-component manufacturing method, it is preferable that a first conductive member having a plurality of lead sections is pre-formed and each of the first to fifth steps is executed for connecting each lead section of the first board and each electrode of the second board.

In the first electronic-component manufacturing method, it is preferable that an opening is formed in a location of the platform underneath the electrode and a high-pressure gas tank communicating with the opening is provided, and in the fourth step high-pressure gas is introduced from the high-pressure gas tank into the opening at the time of application of pressure by the pressure applying jig, to apply to the second board a pressure opposing a pressure exerted by the pressure applying jig. Additionally, in the first electronic-component manufacturing method, it is preferable that an elastic film is provided over the opening of the platform and in said fourth step a pressure opposing a pressure exerted by the pressure applying jig is applied to the second board by having the elastic film expanded upon introduction of high-pressure gas.

In accordance with the above arrangement, even if a device is mounted on a surface opposite to a surface in which an electrode of the second board is formed, the first board and the second board can be connected together by burying the device in the opening of the platform, with no application of pressure by the pressure applying jig to the device. Damage to the device can be prevented. The device does not come out of the board.

In the first electronic-component manufacturing method, it is preferable that (a) the first board further comprises a first adhesive layer provided between the base member and the conductive member, a second adhesive layer provided between the conductive member and the covering member, and a notch section formed by cutting a part of a side face of the covering member, (b) in the second step the photosetting adhesive resin is applied to a part, exposed by the notch section, of the first adhesive layer on the first board, and (c) in the fifth step the photosetting adhesive resin attached to the notch section of the covering member is irradiated with ultraviolet rays.

In accordance with the above arrangement, adhesion force is exerted between the first adhesive layer of the first board and the photosetting adhesive resin in the notch section. Therefore, an adhesion higher than an adhesion force between the covering member of a plastic film and the photosetting adhesive resin can be obtained. This enhances the connection of the first board with the second board.

In the first electronic-component manufacturing method, it is preferable that in the second step the photosetting adhesive resin is applied to a wider area including a part of the first adhesive layer exposed at the notch section and a part of the covering member around the exposed first adhesive layer.

In accordance with the above arrangement, even if the first board is bent in the vicinity of the notch section, such bending takes place in an area including the covering member. Therefore, a sharp bend as is created when the first board is bent at an area not including the covering member is not created. Damage to the covering member can be prevented. The resistivity of the conductive member is not increased. The first board and the second board are sufficiently connected together.

In the first electronic-component manufacturing method, it is preferable that the fourth step further comprises placing a reinforcing plate on a surface of the first board opposite to the first conductive member of the base member in such a way that the reinforcing plate extends over a part of the notch section and an area next to the notch section covered with a cover film.

The present invention provides a second method of manufacturing an electronic component. In this second method, (a) a first flexible board is pre-formed by placing on a surface of a base member of glass a conductive member in the form of a layer extending along the base member and a covering member in the form of a layer with which a part of the conductive member is covered, (b) the first board has a body portion formed by the laminations of the base portion, the conductive member, and the covering member and a lead section that is an exposed part of the conductive member not covered with the covering member, and (c) the lead section of the first board is connected with an electrode of a second board having thereon a device. The electronic component manufacturing method comprises:

a first step of placing the second board on a platform with a surface of the second board carrying thereon the electrode facing upwardly;

a second step of applying to at least one of the first board and the second board a photosetting adhesive resin that is volume-shrinkable;

a third step of aligning the lead section of the conductive member on the first board with the electrode of the second board and placing the first board on the second board;

a fourth step of applying a pressure to the first board by means of a pressure applying jig of an ultraviolet-transmissive material, to connect the lead section of the first board with the electrode of the second board by the applied pressure, wherein the pressure applying jig has a flat end face acting as a pressuring surface, and at least one side face of the pressure applying jig and a direction of travel of ultraviolet rays through the pressure applying jig are tilted at almost the same angle with respect to a direction normal to the pressurizing surface;

a fifth step of sending rays of ultraviolet to the photosetting adhesive resin via the pressure applying jig and the base member of the first board.

The first board of the second method finds a wider application range. Additionally, the pressure applying jig is tilted at an angle with respect to a direction normal to its pressurizing surface. As a result of such arrangement, possible interference of devices, arranged above the platform, with the pressure applying jig can be avoided. Additionally, pressure is diagonally applied, so that impact force to the glass board can be reduced. Damage to the glass board can be prevented.

In the second electronic-component manufacturing method, the pressure applying jig may be formed by a bundle of optical fibers. Additionally, the provision of an opening in the platform is preferable.

BRIEF DESCRIPTION OF THE DRAWINGS

FIG. 14 cross-sectionally depicts a conventional connecting way employing a soldering process and a pressure welding process using an anisotropic conductive sheet,

DETAILED DESCRIPTION OF THE INVENTION

EMBODIMENT 1

Figure 1:
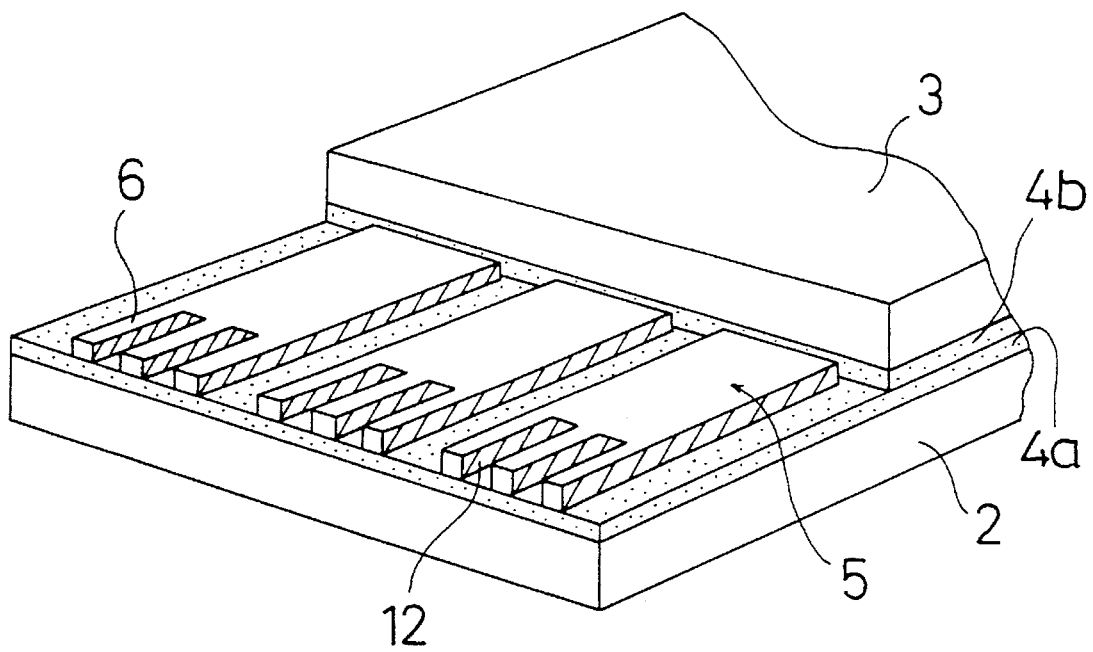
FIG. 1 is a perspective view depicting a flexible wiring board according to a first embodiment of the present invention.

A flexible wiring board (FWB) 1 (i.e., a first wiring board) is made up of the following structural elements: a base film 2 (i.e., a base member); a covering film 3 (i.e., a covering member); an adhesive layer 4 which is made up of a first adhesive layer 4a and a second adhesive layer 4b, the layers 4a and 4b being formed between the base film 2 and the covering film 3; and three conductive members 5, 5, 5 (see FIG. 1). FIG. 1 shows only an end area of the FWB 1. Note that the FWB 1 usually has a uniform width and extends for a predefined distance. Generally, when mounted onto a printed circuit board, the FWB 1 is most likely to be bent at a certain point. Therefore, the FWB 1 is structured to withstand plastic deformation. In the present embodiment, a major part of the FWB 1 (i.e., the base film 2 and the covering film 3) is made of a flexible, ultraviolet-transmissive material such as polyester.

The conductive members 5, 5, 5 run parallel with one other in the longitudinal direction of the FWB 1. Each conductive member 5 has an exposed section not covered with the covering film 3 at a leading end thereof where the FWB 1 is to be connected with an electrode of a printed circuit. Such an exposed section of the conductive member 5 acts as a lead 6. The lead 6 has, at its leading end area, a row of grooves 12 running in the longitudinal direction of the FWB 1 (see FIG. 1). The width of the groove 12 is greater than the width of a remaining part of the lead 6 defined by the grooves 12 but not greater than a space formed between each lead 6.

Figure 4:
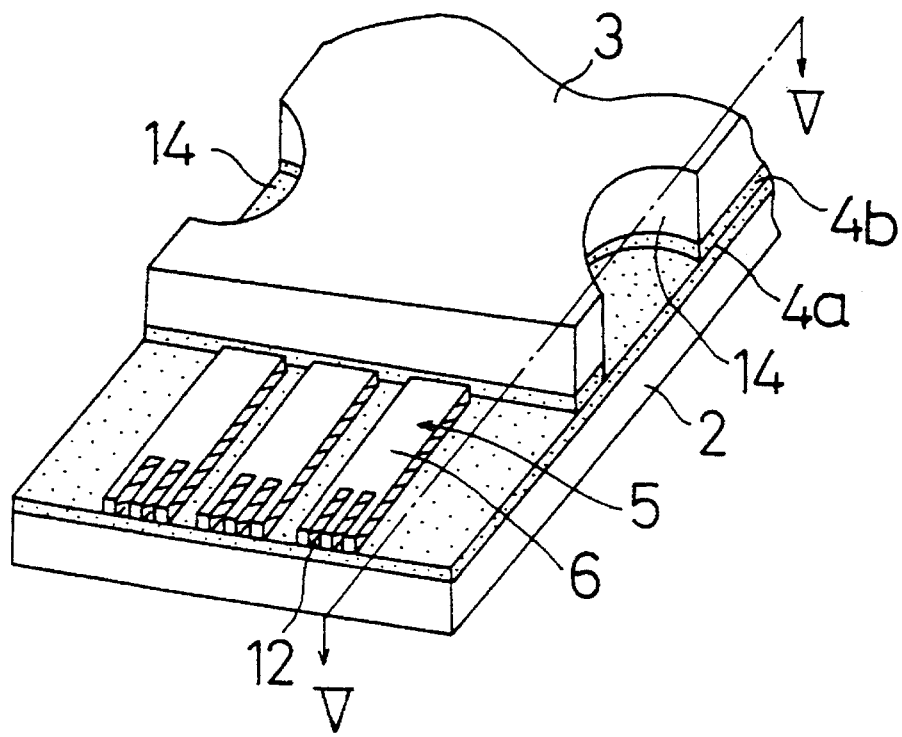
FIG. 4 is a perspective view depicting a flexible wiring board with a notch section.

As shown in FIG. 4, the cover film 3 is partly cut out to such an extent that the conductive member 5 remains intact, to form a notch section 14. The reason for providing this notch section 14 is to provide a greater connecting strength between the FWB 1 and a printed circuit board (PCB) 7.

Referring now to FIGS. 2a–e, a connecting procedure of establishing connection between the FWB 1 and the PCB 7 will be described below.

Figure 2A:
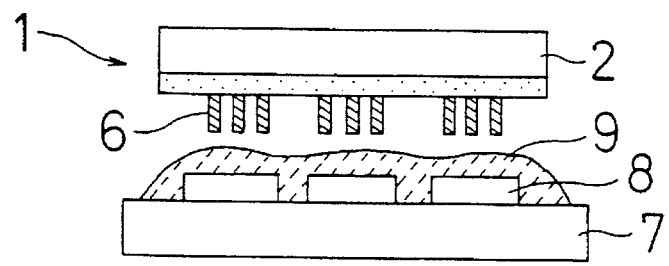
FIG. 2a–e cross-sectional views illustrating five different stages of a connecting procedure of the first embodiment.

First, as shown in FIG. 2a, the FWB 1 carrying thereon the lead 6 and the PCB 7 carrying thereon the electrode 8 are arranged so that they face each other. More specifically, the PCB 7 is placed on a platform (not shown in the figure), with its surface carrying thereon the electrode 8 facing upwardly. The FWB 1 is held above the PCB 7, with its surface carrying thereon the lead 6 facing downwardly. Then, a photosetting adhesive resin 9, which has insulating and volume shrinkage properties, is applied to the PCB 7 as well as to the electrode 8. Then, the lead 6 of the FWB 1 and tile electrode 8 of the PCB 7 are aligned with each other. The photosetting adhesive resin 9 may be applied to the FWB 1.

Figure 2B:
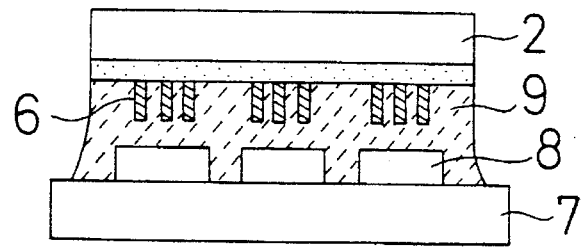

Next, as shown in FIG. 2b, the lead 6 of the FWB 1 is placed onto the electrode 8 of the PCB 7. The photosetting adhesive resin 9 lies between the lead 6 and the electrode 8 as well as in the notch section 14.

Figure 2C:
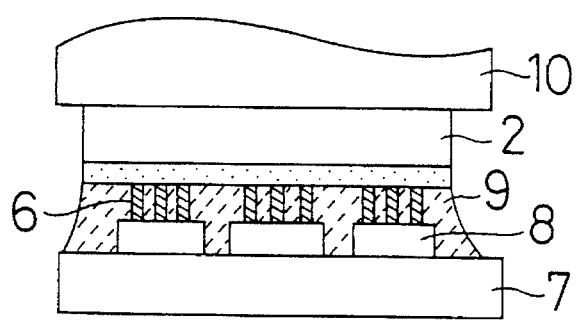

As shown in FIG. 2c, pressure is applied to the lead 6 by means of a pressure applying jig 10 formed by an ultraviolet-transmissive material, e.g., quartz glass, whereupon the lead 6 and the electrode 8 are press-welded together. The photosetting adhesive resin 9, trapped between the lead 6 and the electrode 8, flows out accordingly, whereupon the lead 6 and the electrode 8 are electrically connected together.

To prevent the photosetting adhesive resin 9 from attaching to the pressure applying jig 10, a coating of Teflon (trademark) is applied to at least a part of a pressurizing surface of the pressure applying jig 10.

Figure 2D:
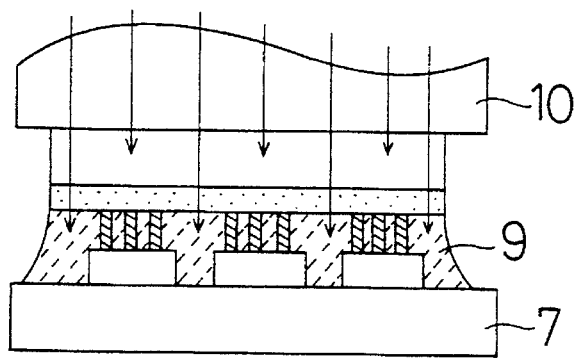

Next, as shown in FIG. 2d, ultraviolet rays strike the photosetting adhesive resin 9 trapped between the boards, via the pressure applying jig 10 and the base film 2. When irradiated with the ultraviolet rays, the photosetting adhesive resin 9 hardens, whereupon the FWB 1 and the PCB 7 are connected together mechanically.

Figure 2E:
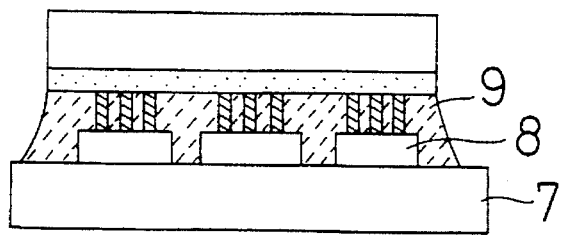

As shown in FIG. 2e, the pressure applying jig 10 stops pressurizing. The connecting procedure is then completed. Even after the pressure applying jig 10 stops applying pressure, the lead 6 and the electrode 8 are connected together because of a volume shrinkage force exerted by the photosetting adhesive resin 9. This electrically connects the lead 6 and the electrode 8 with a greater connecting strength.

In the present embodiment, the photosetting adhesive resin 9 is used. This permits the FWB 1 and the PCB 7 to be connected together at room temperature. In other words, the connecting procedure of the present embodiment requires no heating treatment. This allows polyester which is inexpensive to be used to form the base film 2 and the cover film 3. No soldering is carried out, so that there is no need to use lead and no washing step to remove a flux is required.

In the present embodiment, the pressure applying jig 10 is ultraviolet-transmissive. As a result of such arrangement, irradiation of ultraviolet can be carried out from the FWB's 1 side. Additionally, the second wiring board (i.e., the PCB 7) can be formed by those other than ultraviolet-transmissive materials such as glass. The present invention enables the FWB 1 to be connected with an opaque board, e.g., a printed circuit board, at room temperature. This not only cuts down the production cost of the FWB 1 but also provides a wider application range thereof.

The photosetting adhesive resin 9 may be epoxy resin, silicon resin, and acrylic resin each of which hardens when irradiated with ultraviolet. The lead 6 is solderplated or is plated with Au, Cu, Sn, or Ni.

Figure 3:
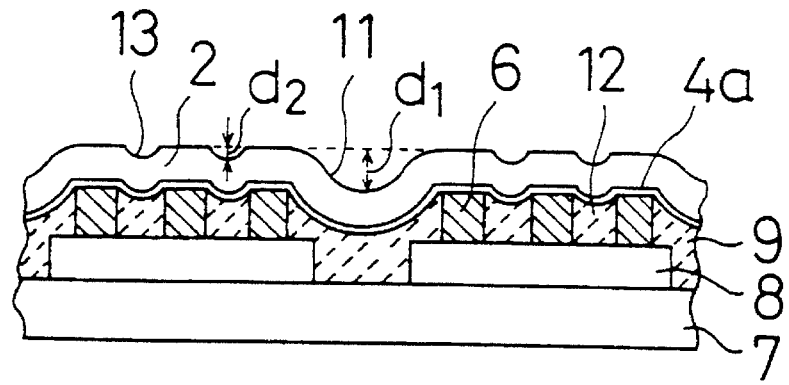
FIG. 3 is a cross-sectional view illustrating how a flexible wiring board and a printed circuit board are connected together at a leading end area of a lead section.

The operation and effect of the groove 12 is described by making reference to FIG. 3. A part of FIG. 2e drawn almost to scale is shown in FIG. 3.

As shown in FIG. 3, when the photosetting adhesive resin 9 sets, this produces a recess 11 at an area of the base film 2 defined between the adjoining leads 6, according to the volume shrinkage force of the photosetting adhesive resin 9. This volume shrinkage force produces a compressive stress force between the lead 6 and the electrode 8. Further, in the present embodiment, the lead 6 has the grooves 12. This forms a recess 13 in a location of the base film 2 corresponding to the groove 12, according to the volume shrinkage force of the photosetting adhesive resin 9. This volume shrinkage force produces a compressive stress force between the lead 6 and the electrode 8. To sum up, with respect to a leading end area of one lead 6, there are four column-like energizing members (two at the ends and two in the middle) each of which produces a respective compressive stress force between the lead 6 and the electrode 8. In accordance with the present embodiment, as described above, each lead 6 has, at its leading end, the grooves 12. This assures that the lead 6 and the electrode 8 are positively connected together electrically. Adhesion force between the photosetting adhesive resin 9 and the first adhesive layer 4a exerts on the groove 12. Such an adhesion force is greater than an adhesion force by the photosetting adhesive resin 9 to the lead 6. This increases the reliability of the connection of the FWB 1 and the PCB 7.

In the present embodiment, the width of the groove 12 is narrower than the width of the remaining portion of the lead 6. In other words, the remaining portion of the lead 6 has an area enough for preventing the increase in electrical resistance at the lead's 6 leading end.

In the present embodiment, an interval between each lead 6 is wider than the width of the groove 12. The depth of the recess 11 (d1) is greater than the depth of the recess 13 (d2). In other words, a lead/electrode compressive stress caused by the volume shrinkage force of the photosetting adhesive resin 9 between the adjoining leads 6, 6 is greater than a compressive stress of the groove 12.

Figure 5A:
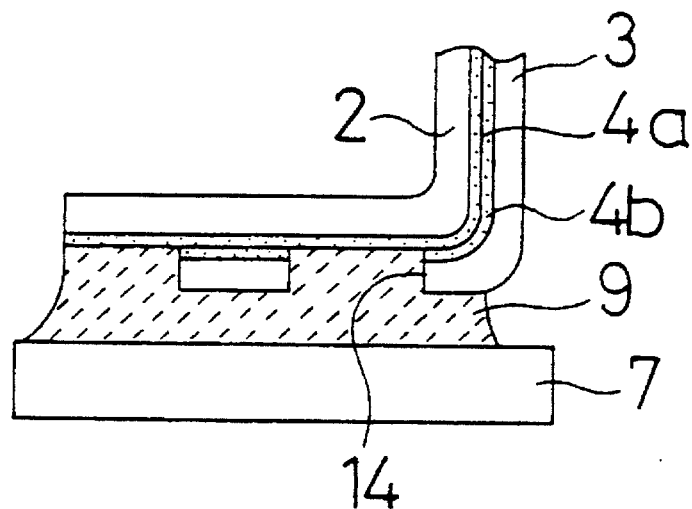
FIGS. 5a and 5b are cross-sectional views showing different bends occurring in flexible wiring boards due to differences in the manner of how a notch section is filled with a photosetting adhesive resin.
Figure 5B:
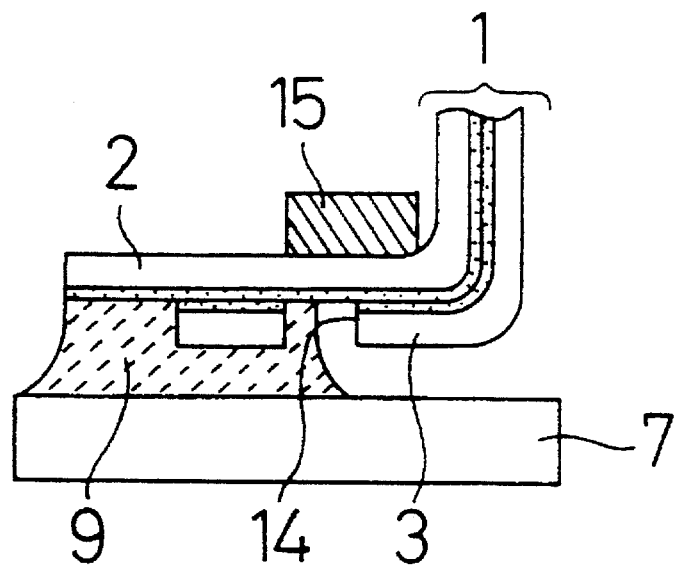

The operation and effect of the notch section 14 will now be described below (see FIG. 4). FIGS. 5a and 5c each illustrate a step of connecting the FWB 1 and the PCB 7 as shown in FIG. 2. FIGS. 5a and 5b are cross-sectional views taken along line V—V of FIG. 4. As shown in FIG. 5a, the photosetting adhesive resin 9 in the notch section 14 serves to connect the first adhesive layer 4a and the PCB 7. The adhesive layer 4 and the PCB 7 are connected together by a greater adhesion force in the notch section 14 in comparison with an adhesion force exerted between the covering film 3 of polyester and the PCB 7.

Usually, adhesion force between the first adhesive layer 4a and the photosetting adhesive resin 9 is about 200 g/mm or more.

Where the notch section 14 is formed in the FWB 1, it is preferable that the photosetting adhesive resin 9 is applied to an area including the cover film 3 around the notch section 14 in the step of FIG. 2a. The reason for this is as follows.

Figure 13:
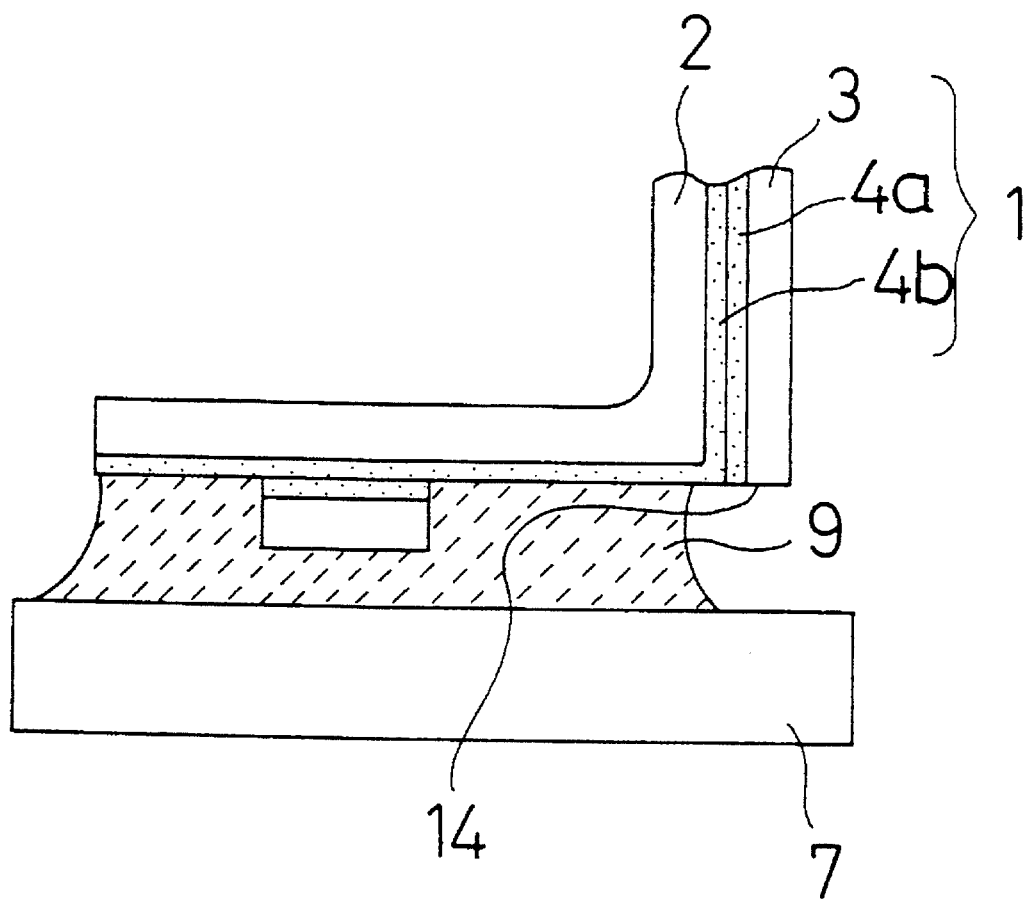

In the connecting step as shown in FIG. 13 (prior art), the entire of the notch section 14 is not sufficiently filled with the photosetting adhesive resin 9. In such a case, the bendability radius becomes smaller, thereby producing a bend. This situation causes the base film 2 to be damaged. Further, the conductive member 5 in the vicinity of the bend, too, bends at a small bendability radius. Micro-cracking results. This may increase the resistivity of the conductive member 5 in the FWB 1.

If, as shown in FIG. 5a, the filling of the photosetting adhesive resin 9 is performed covering a range wider than the notch section 14, this will not produce a bend state even when the FWB 1 is bent, since the boundary between the notch section 14 and the covering film 3 is covered with the photosetting adhesive resin 9. As a result of such arrangement, the base film 2 is not damaged and the increase in the resistivity of the conductive member 5 can be prevented.

Next, the operation and effect of a reinforcing plate 15 will be described (see FIG. 5b). This reinforcing plate 15 is placed on the base film 2. More specifically, the reinforcing plate 15 is placed on a surface region of the base film 2 opposite to the covering film 3 in such a way that the reinforcing plate 15 extends over the notch section 14 and a location where the covering film 3 lies. Because of the existence of the reinforcing plate 15 on the base film 2, even when the notch-section 14 is insufficiently filled with the photosetting adhesive resin 9, the bendability radius can be held great. Therefore, the FWB 1 does not suffer from a sharp bend as is shown in FIG. 18. The reinforcing plate 15 provides a greater adhesion Force between the FWB 1 and the PCB 7.

The reinforcing plate 15 may be pre-attached to the FWB 1 prior to the connecting procedure or may be attached during the connecting procedure.

Other types of pressure applying jigs will be described below.

Figure 6A:
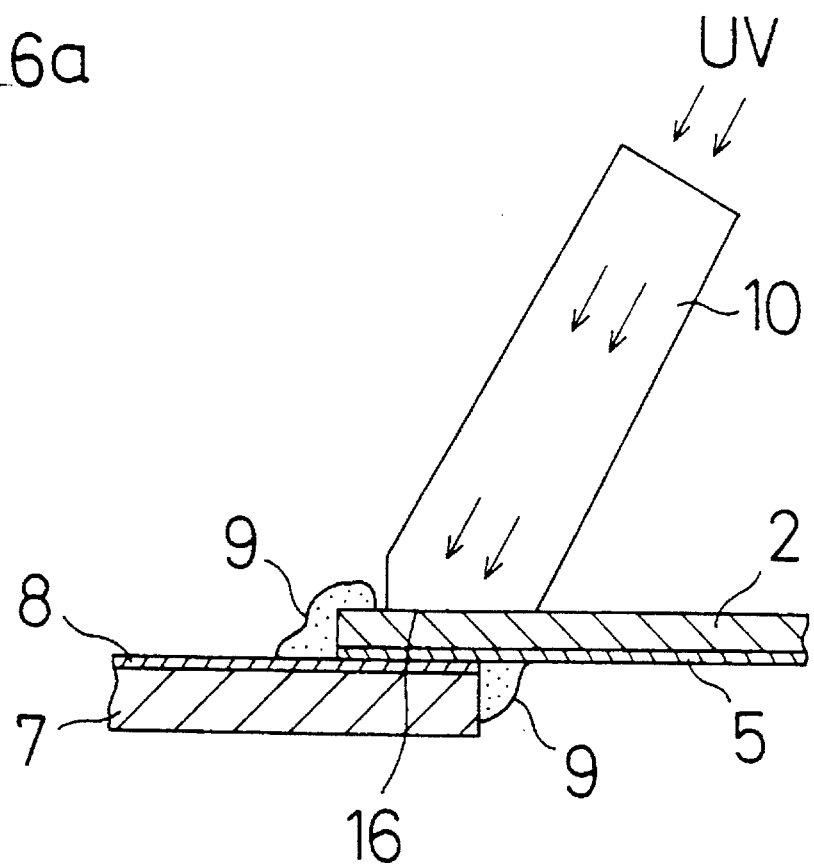
FIG. 6a cross-sectionally shows how two boards are connected together using a pressure applying jig with a side face at a tilt with respect to a direction normal to its end face and FIG. 6b shows how two boards are connected together using another pressure applying jig with a side face at a tilt with respect to a direction normal to its end face.

As shown in FIG. 6a, if the pressure applying jig 10 is tilted in the direction of travel of ultraviolet rays through the pressure applying jig 10, or if the pressure applying jig 10 is tilted at an angle with respect to a direction normal to the end face of the pressure applying jig 10, this prevents interference with the upper portion of the pressure applying jig 10. For example, even in such a case where there is a protecting cover of the system above a platform onto which the PCB 7 is placed, the FWB 1 and the PCB 7 can be connected together with no interference occurring between the protecting cover and the pressure applying jig 10. Additionally, when visually inspecting the alignment of the PCB 7 with the FWB 1 from above, such inspection work will not be obstructed by the presence of the pressure applying jig 10. This provides an increased connecting accuracy.

Figure 6B:
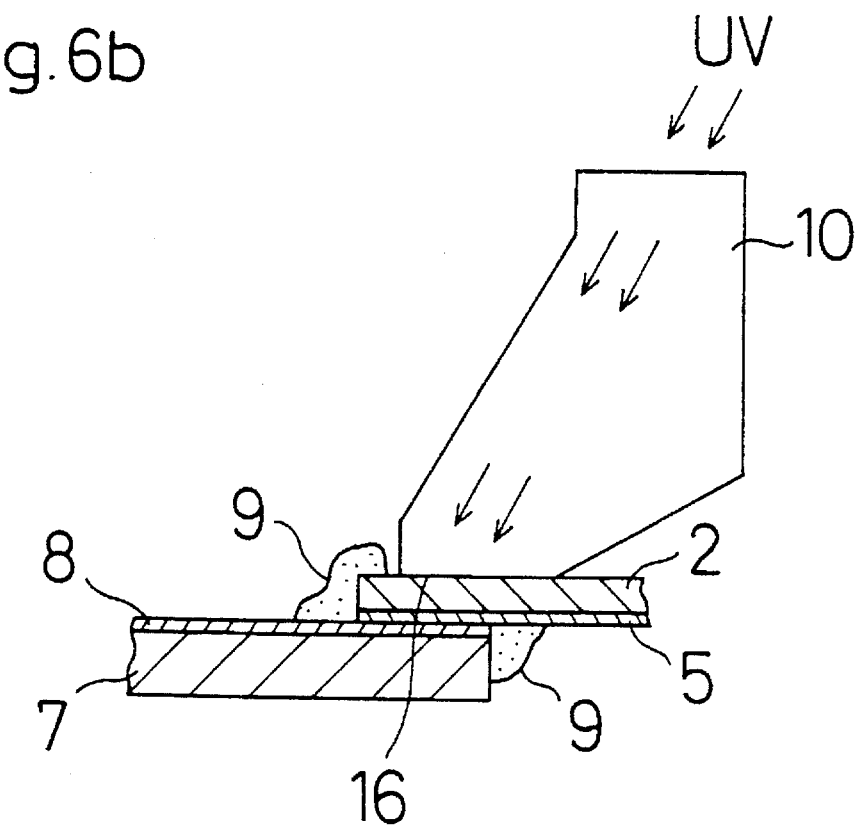

It is not necessary to form a lower side face of the pressure applying jig 10 along the direction of travel of ultraviolet rays. For example, as shown in FIG. 6b, the upper part of a lower side face of the pressure applying jig 10 is perpendicular to the pressurizing surface 16 and only the upper part thereof is tilted at an angle with respect to a direction normal to the pressuring surface 16.

Figure 7A:
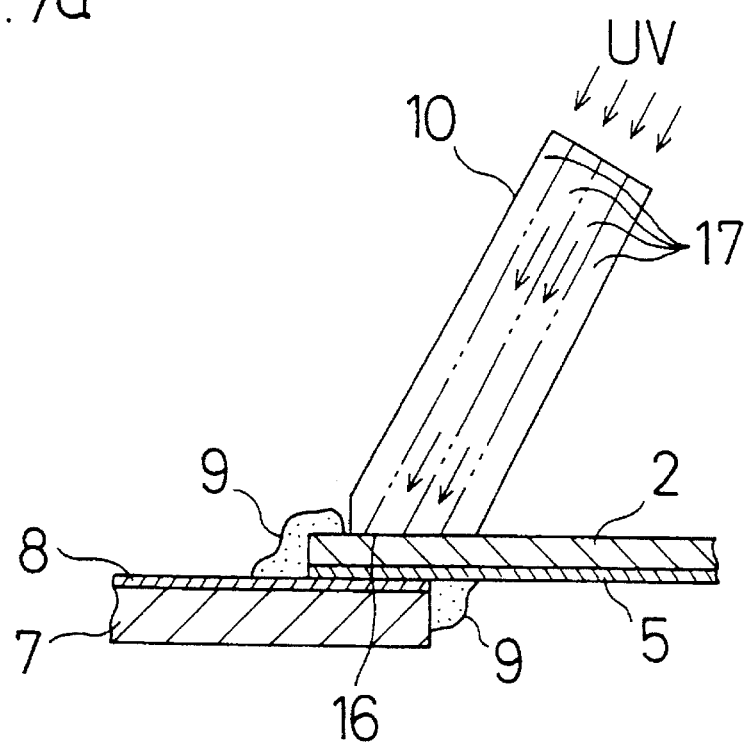
FIG. 7a cross-sectionally shows how two boards are connected together using a pressure applying jig made up of a bundle of optical fibers and FIG. 7b cross-sectionally shows how two boards are connected together using another pressure applying jig made up of a bundle of optical fibers.
Figure 7B:
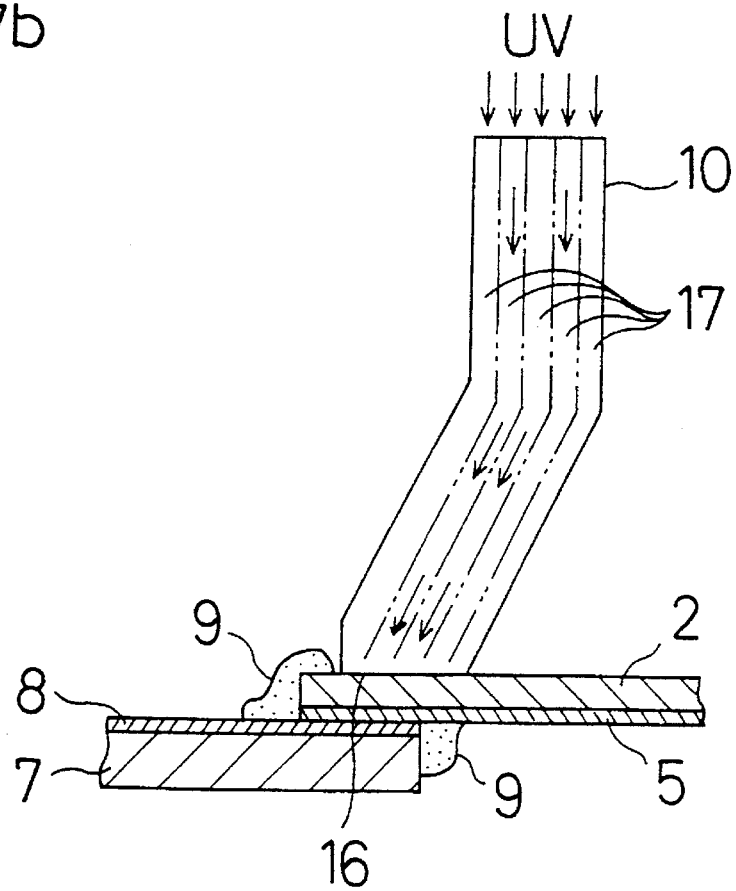

In FIGS. 7a and 7b, the pressure applying jig 10 is formed by a bundle of optical fibers 17. Each optical fiber 17 has an end face acting as the pressurizing surface of the pressure applying jig 10. Use of the pressure applying jig 10 made up of the optical fibers 17 allows the photosetting adhesive resin 9 to be highly irradiated with ultraviolet. This reduces the setting time of the photosetting adhesive resin 9, thereby increasing the productivity. As shown in FIG. 7a, all the optical fibers 17 may be tilted at an angle with respect to a direction normal to the pressuring surface 16. However, as shown in FIG. 7b, whereas the upper portion of the optical fiber 17 may be perpendicular to the pressuring surface 16, the lower portion may be tilted at an angle with respect to a direction normal to the pressuring surface 16.

Figure 8A:
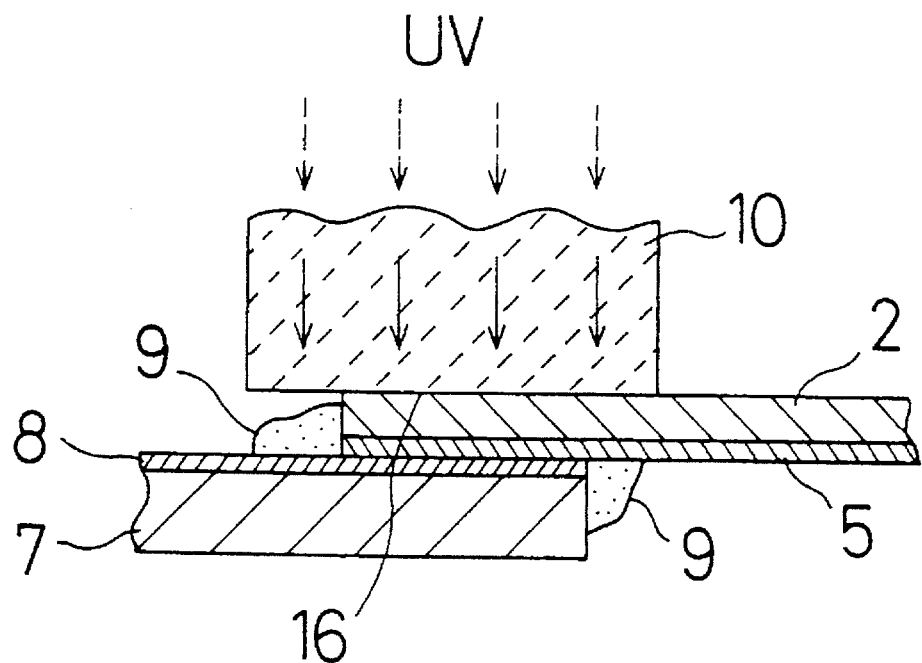
FIG. 8a cross-sectionally shows how two boards are connected together using a pressure applying jig having a region to be irradiated with ultraviolet irradiation that is greater than its pressurizing surface area and FIG. 8b cross-sectionally shows how two boards are connected together using another pressure applying Jig having a region to be irradiated with ultraviolet irradiation that is greater than its pressurizing surface area.
Figure 8B:
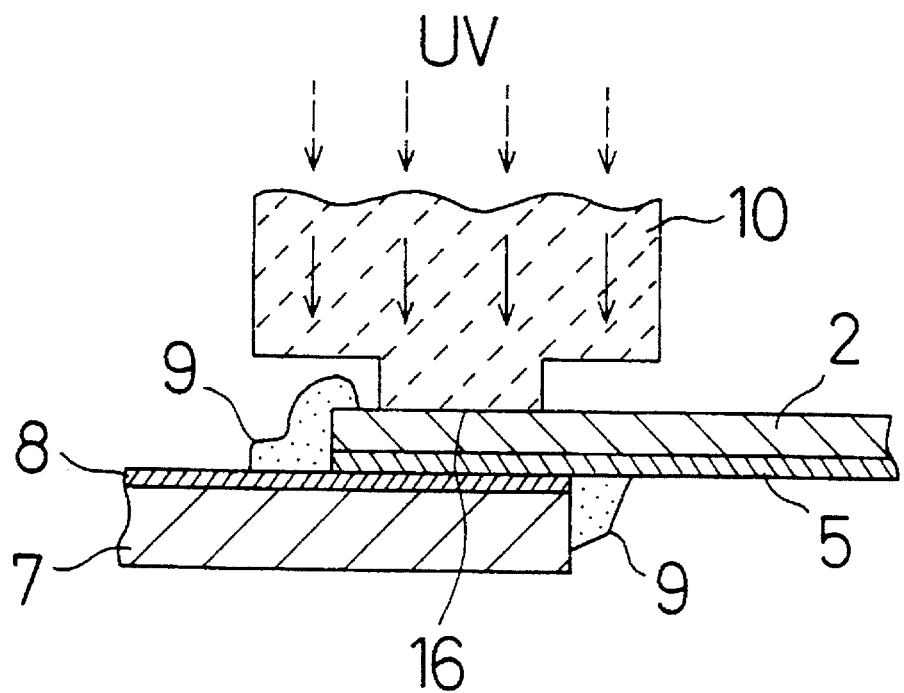

FIG. 8a shows a revision of the pressure applying jig 10. This revision has an end face a part of which acts as the pressuring surface 16. FIG. 8b shows another revision of the pressure applying jig 10 whose end section has a projecting step acting as the pressuring surface 16. The pressuring surface 16 of the pressure applying jig 10 of FIG. 8a partly sticks out. This can provide an ultraviolet irradiated region wider than the pressuring surface 16. This arrangement enables the photosetting adhesive resin 9 oozed out of the FWB 1 to harden.

EMBODIMENT 2

Referring now to FIGS. 9a to 9f, a second embodiment of the present invention will be described below. In accordance with the present embodiment, electrodes of different boards can be connected together. For example, an electrode of a semiconductor device and an electrode of a printed circuit board can be connected together through the FWB 1.

Figure 9A:
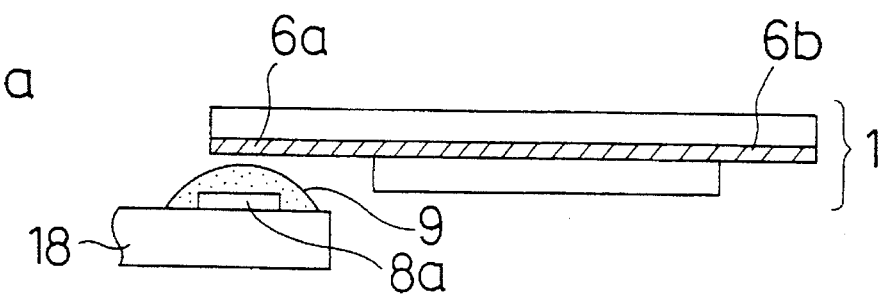
FIGS. 9a–f are cross-sectional views illustrating six different stages of a connecting procedure of a second embodiment of the present invention.

As shown in FIG. 9a, a semiconductor board 18, onto which a semiconductor device with electrode 8a is mounted, is placed on a platform (not shown), with its surface carrying thereon the electrode 8a facing upwardly. The FWB 1 is provided with a first lead 6a at one end and a second lead 6b at the other end. While holding the FWB 1 with its surface carrying the first lead 6a facing upwardly, the photosetting adhesive resin 9 is applied to around the electrode 8 of the semiconductor board 18. Then, the first lead 6a of the FWB 1 and the electrode 8a of the semiconductor board 18 are aligned with each other.

Figure 9B:
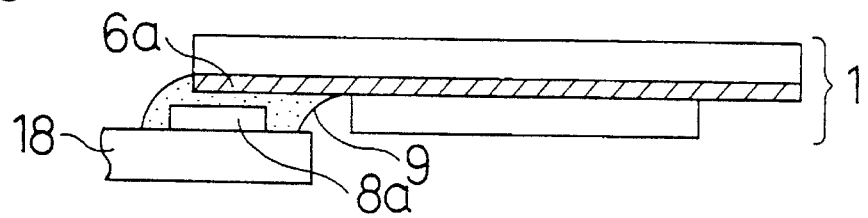

Next, as shown in FIG. 9b, the first lead 6a is placed onto the electrode 8a of the semiconductor board 18. The photosetting adhesive resin 9 is all over the first lead 6a and the electrode 8a.

Figure 9C:
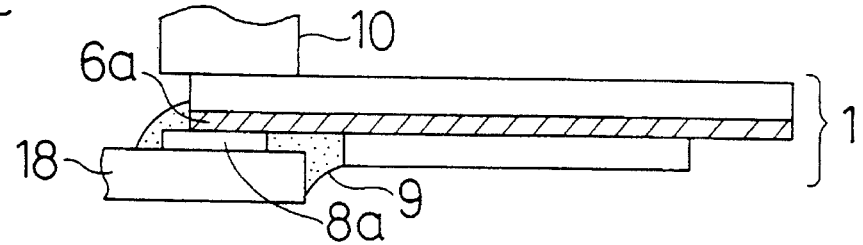
Figure 9D:
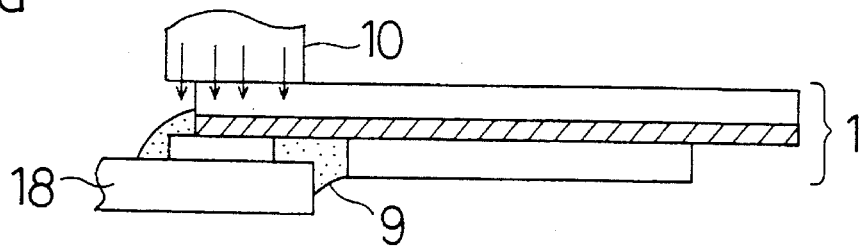

Next, as shown in FIG. 9c, the pressure applying jig 10 applies a pressure onto the first lead 6a, whereupon the first lead 6a and the electrode 8a are pressure-welded together. Further, as shown in FIG. 9d, ultraviolet rays strike the photosetting adhesive resin 9 filled between the boards, via the pressure applying jig 10 and the base film 2. When irradiated with the ultraviolet rays, the photosetting adhesive resin 9 hardens.

Figure 9E:
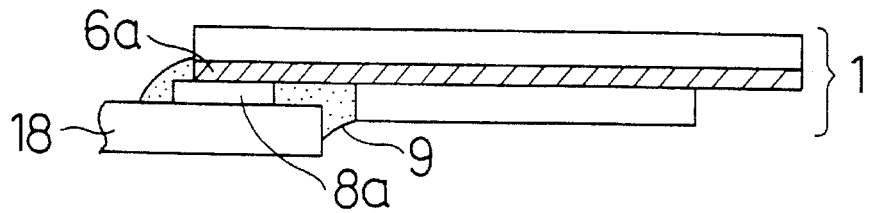

As shown in FIG. 9e, application of pressure by means of the pressure applying jig 10 is stopped. The connecting procedure for establishing connection between the FWB 1 and the semiconductor board 18 is completed.

The above-described connecting procedure is basically identical with the one as shown in FIGS. 2a–e. In other words, the first lead 6a and the electrode 8a are pressure-connected by a volume shrinkage force exerted when the photosetting adhesive resin 9 becomes hard. This permits the first lead 6a and the electrode 8a to be connected together with a greater connecting force.

Figure 9F:
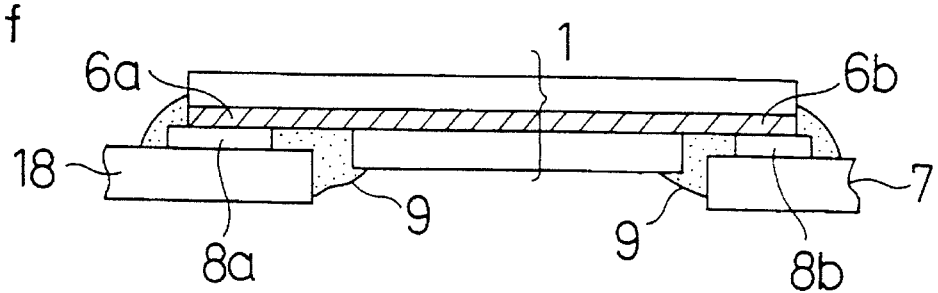

Likewise, as shown in FIG. 9f, the second lead 6b of the FWB 1 and the electrode 8 of the PCB 7 are connected together in the same way as described above (see FIGS. 9a to 9e).

It is possible that the semiconductor board 18 and the FWB 1 are connected together at the same time that the PCB 7 and the FWB 1 are connected together, which is time saving.

As described above, in accordance with the present embodiment, electrical connection between electronic components as well as electrical connection between electrodes of different boards can be established through the FWB 1. If, like the first embodiment, the pressure applying jig 10 is formed by an ultraviolet-transmissive material, this enables the connecting procedure to be performed at room temperature. This not only cuts down the cost of material forming the FWB but also provides a wider range of applications. In FIGS. 9c and 9d, ultraviolet rays pass through the pressure applying jig 10 in parallel with a direction normal to the pressurizing surface. However, as in the first embodiment, it may be so arranged that the direction of travel of ultraviolet rays through the pressure applying Jig 10 is tilted at an angle with respect to a direction normal to the pressuring surface.

EMBODIMENT 3

A third embodiment of the present invention will be described by making reference to FIGS. 10a–10e. The FWB 1 according to the first embodiment may be used. In the present embodiment, however, the lead 6 that is beforehand plastic-deformed by application of pressure is used.

Figure 10A:
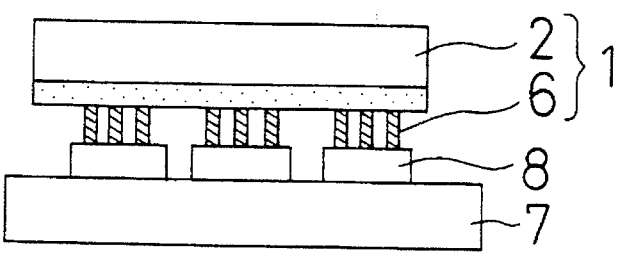
FIGS. 10a–e a cross-sectional views illustrating five different stages of a connecting procedure of a third embodiment of the present invention.

As shown in FIG. 10a, the lead 6 of the FWB 1 is placed on the electrode 8 of the PCB 7. Unlike the first and second embodiments, the photosetting adhesive resin 9 is not applied yet.

Figure 10B:
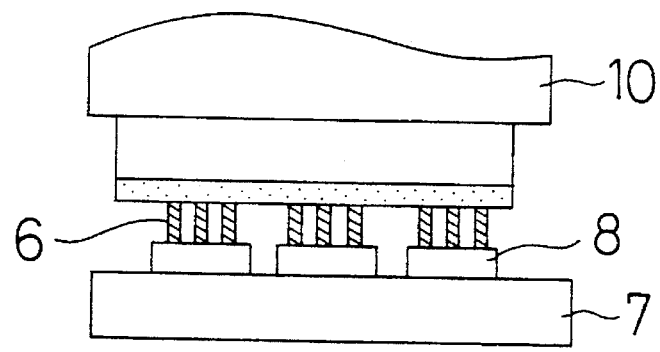

Next, as shown in FIG. 10b, the lead 6 is applied pressure by the pressure applying jig 10, whereupon the lead 6 and the electrode 8 are connected together. The lead 6 and the electrode 8 are connected together electrically.

Figure 10C:
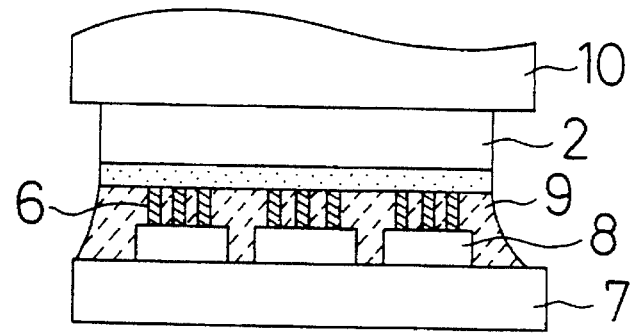

Next, as shown in FIG. 10c, a gap defined between the FWB 1 and the PCB 7 is filled with the photosetting adhesive resin 9, so that a region where the lead 6 and the electrode 8 are connected together is filled with the photosetting adhesive resin 9.

Figure 10D:
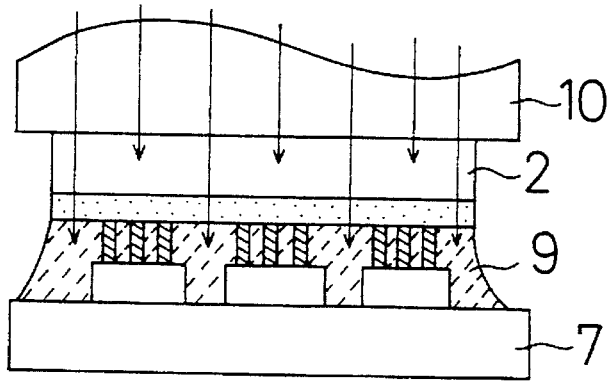

As shown in FIG. 10d, ultraviolet rays strike the photosetting adhesive resin 9, via the pressure applying jig 10 and the base film 2. The photosetting adhesive resin 9 hardens when irradiated with the ultraviolet rays.

Figure 10E:
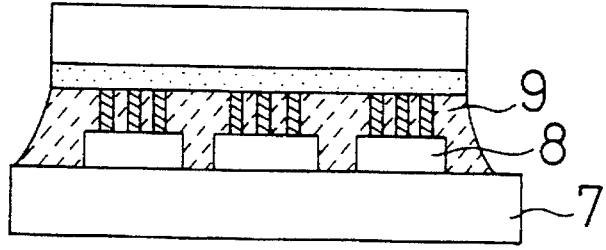

Next, as shown in FIG. 10e, the pressure applying jig 10 stops applying pressure. The connecting procedure of the FWB 1 with the PCB 7 is completed. The lead 6 and the electrode 8 are pressure-welded together by a volume shrinkage force by the photosetting adhesive resin 9, as in the first and second embodiments.

In accordance with the present embodiment, the filling of the photosetting adhesive resin 9 is performed after the lead 6 and the electrode 8 are connected together. This arrangement prevents the photosetting adhesive resin 9 from entering a contact face between the lead 6 and the electrode 8. Accordingly, the lead 6 and the electrode 8 can be connected together with a less pressurizing force, since it is not necessary to push out the photosetting adhesive resin 9 lying between the lead 6 and the electrode 8. The PCB 7 is little damaged by application of pressure. A greater contact region can be created between the lead 6 and the electrode 8 because of the nonexistence of the photosetting adhesive resin 9 between the lead 6 and the electrode 8. The contact resistivity is therefore lowered. As a result, the connection reliability increases.

In accordance with the present embodiment, the lead 6 of the FWB 1 is plastic-deformed beforehand by means of application of pressure prior to the connecting procedure. This arrangement provides the following advantages. There are fine surface irregularities in the surface of the lead 6. When electrically connecting the lead 6 and the electrode 8, the surface of the lead 6 must be flattened to provide a wider contact surface area between the lead 6 and the electrode 8. The lead 6 of the present embodiment is already plastic-deformed by application of pressure, so that it has a flat surface. As a result of such arrangement, the lead 6 and the electrode 8 can be connected together with a less pressuring force, in the step of FIG. 10b. Adequate electrical connection is obtained with less pressuring force, and the PCB 7 is not damaged by application of pressure.

EMBODIMENT 4

A fourth embodiment of the present invention will be described with reference to FIGS. 11a–11c. The present embodiment is most suitable for the PCB 7 carrying an electrode 8 and an electronic component 19 on different surfaces (see FIG. 11a).

Figure 11A:
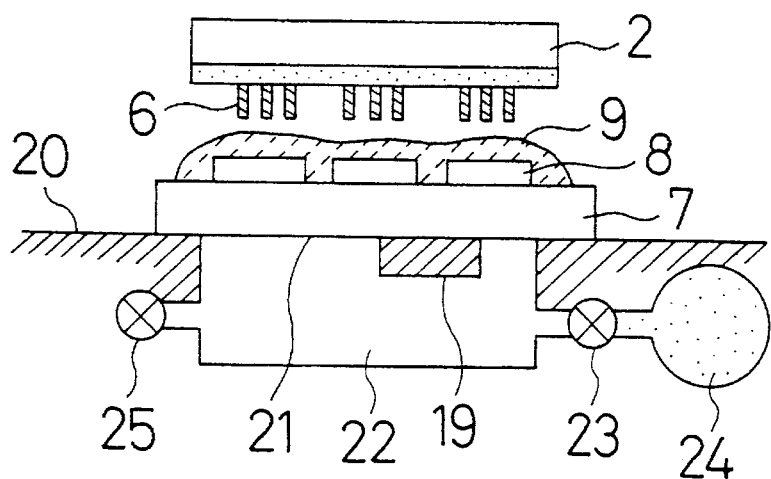
FIGS. 11a–c are cross-sectional views illustrating three different stages of a connecting procedure of a fourth embodiment of the present invention.

As shown in FIG. 11a, the PCB 7 is placed on a platform 20. Formed in an area of the platform 20 underneath the electrodes 8 of the PCB 7 is an opening 21. The electronic component 19, mounted on the underside (in the figure) of the PCB 7, is buried in the opening 21, thereby separating a supporting surface for the platform 20 from the electronic component 19. The opening 21 communicates with a void 22. The void 22, via a high-pressure gas supply valve 23, is communicated with a high-pressure gas tank 24. The void 22 is also connected to an exhaust valve 24 for venting to the atmosphere. An elastic film may provided over the opening 21.

As shown in FIG. 11a, the photosetting adhesive resin 9 is applied to around the electrode 8 of the PCB 7. The lead 6 is aligned with the electrode 8. The lead 6 is placed onto the electrode 8.

Figure 11B:
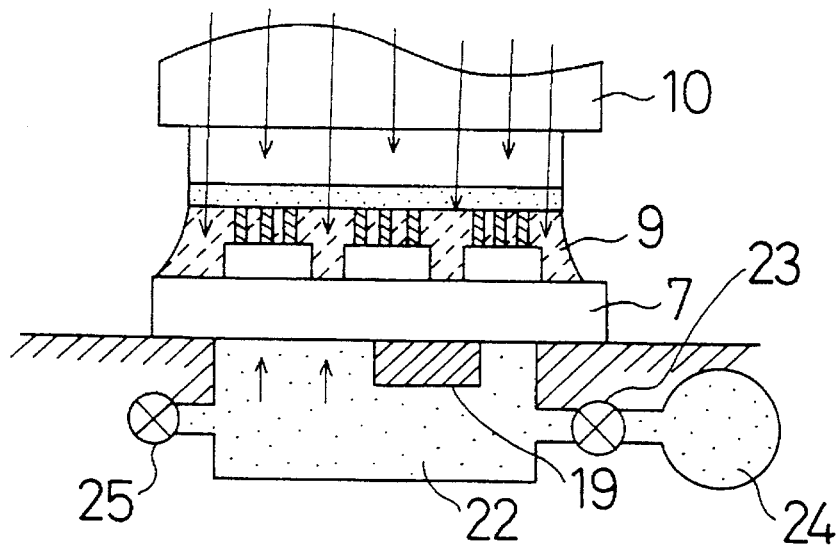

Next, as shown in FIG. 11b, the lead 6 is pressurized using the pressure applying jig 10, whereupon the lead 6 and the electrode 8 is connected together by the applied pressure. At the same time, the high-pressure gas supply valve 23 is opened, so that high-pressure gas is introduced into the void 22 from the high-pressure gas tank 24. The void 22 enters the high-pressure state, which applies to the PCB 7 a pressure against a pressurizing force by the pressure applying jig 10.

If an elastic film is provided over the opening 21, this results in applying to the PCB 7 a pressure opposing a pushing force exerted by the pressure applying jig 10, when the elastic film expands (not shown in the figure).

Next, as shown in FIG. 11b, ultraviolet rays strike the photosetting adhesive resin 9 lying between the boards, via the pressure applying Jig 10 and the base film 2. When irradiated with the ultraviolet rays, the photosetting adhesive resin 9 hardens.

Figure 11C:
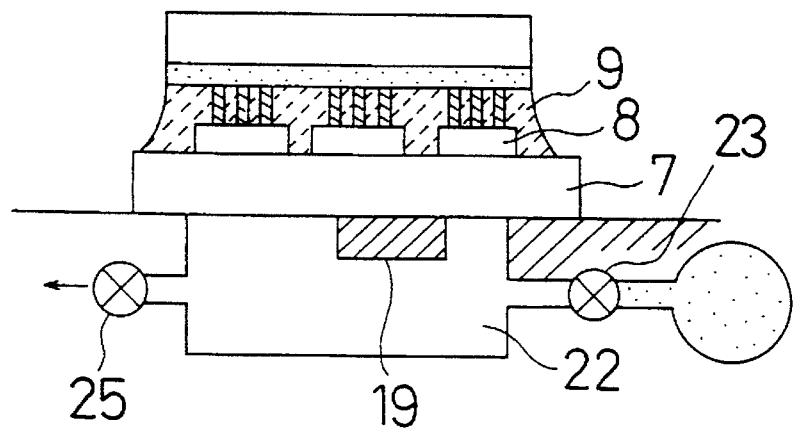

As shown in FIG. 11c, the pressure applying jig 10 stops pressuring. At the same time, the exhaust valve 25 is opened and the high-pressure gas supply valve 23 is closed. As a result, the void 22 is vented to the atmosphere. The connecting procedure is completed.

The operation and effect of the platform 20 having the opening 21 is explained. If the platform 20 is not provided with the opening 21, the electronic component 19 is caught between the PCB 7 and the platform 20 and the pressurizing force is concentrated on the electronic component 19. The electronic component 19 may be separated from the PCB 7 or damaged.

In the present embodiment, however, the platform 20 is provided with the opening 21. The electronic component 19 is not brought in Contact with the platform 20. The present embodiment thus does not suffer from the above-identified drawback. Further, the void 22 is made to enter the high-pressure state thereby applying to the PCB 7 a pressure opposing a pressuring force exerted by the pressure applying jig 10. As a result, the PCB 7 will not bend and suffer from any deformation.

EMBODIMENT 5

Figure 12A:
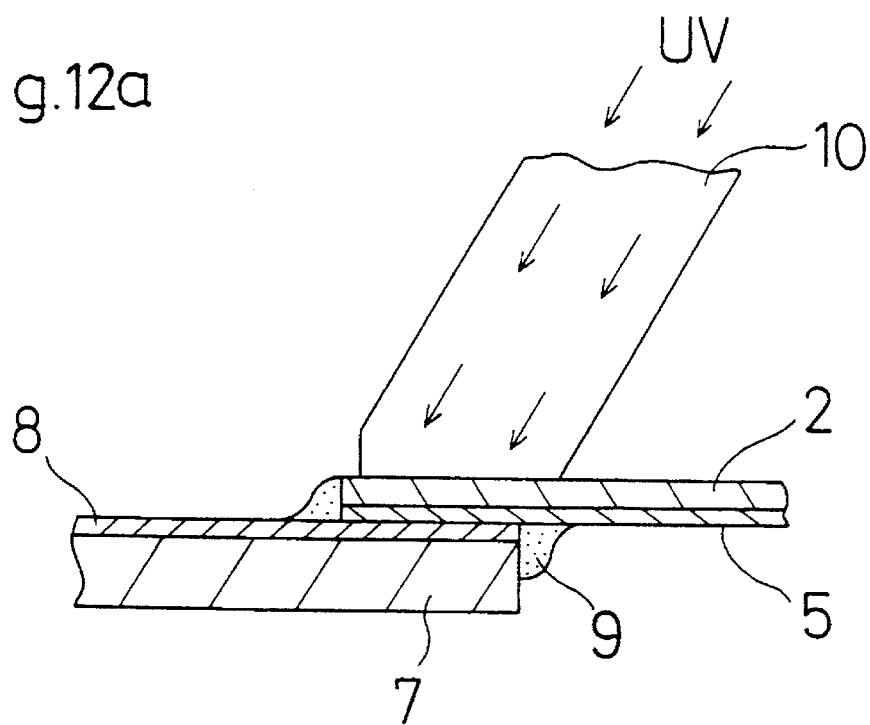
FIGS. 12a and 12b depict examples of a fifth embodiment of the present invention in which two different pressure applying jigs are used, FIG. 13 cross-sectionally depicts a conventional connecting technique employing a photosetting adhesive resin.

A fifth embodiment of the present invention is now described below with reference to FIGS. 12a and 12b. FIG. 12a shows an example where instead of using a flexible wiring board a board with a conductive member 35 on a glass board 32 is employed and the conductive member 35 and the electrode 8 of the PCB 7 are electrically connected together. Ultraviolet rays pass through the pressure applying jig 10 and the glass board 32 and strike the photosetting adhesive resin 9. By making use of a volume shrinkage force exerted by the photosetting adhesive resin 9, the boards are mechanically connected together and the conductive member 35 and the electrode 8 are electrically connected together, as in the first to fourth embodiments.

In the present embodiment, the pressure applying jig 10 has side faces which are tilted at an angle with respect to a direction normal to the end face of the pressure applying jig 10. Additionally, the direction of travel of ultraviolet rays passing through the pressure applying jig 10 is tilted in the same manner that the side faces of the pressure applying jig 10 are tilted. As a result of such arrangement, possible interference with other systems can be prevented and the alignment of the conductive member 35 with the electrode 8 can be performed accurately. Further, the pressure applying jig 10 applies pressure in a diagonal direction, so that impact force to the glass board 32 can be reduced. Damage to the glass board 32 can be prevented.

Figure 12B:
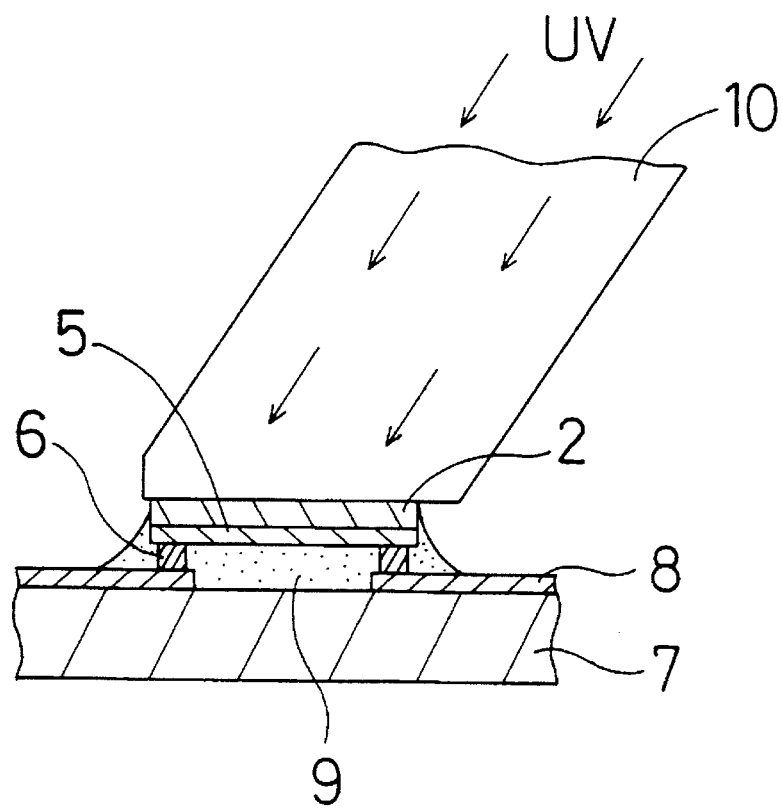

FIG. 12b shows an example where a bump 36 is formed on the conductive member 35 of the glass board 32 and the bump 36 and the electrode 8 of the PCB 7 are electrically connected together. In the present embodiment, it is designed such that the width of the pressure applying jig 10 is greater than the width of the glass board 32. This makes even a photosetting adhesive resin oozed out of the glass board 32 harden.

The invention claimed is:

1. A method of manufacturing an electronic component wherein:

a first flexible board is pre-formed by placing, onto a surface of a base member of an ultraviolet-transmissive flexible material, a conductive member in the form of a layer extending along said base member and a flexible covering member in the form of a layer with which a part of said conductive member is covered;

said first board has a body portion formed by laminations of said base member, said conductive member, and said covering member, and a lead section that is an exposed part of said conductive member not covered with said covering member;

said lead section of said first board is connected with an electrode of a second board having thereon a device;

said electronic-component manufacturing method comprising:

a first step of placing said second board on a platform, with a surface of said second board carrying thereon said electrode facing upwardly;

a second step of applying to at least one of said first board and said second board a photosetting adhesive resin that is volume-shrinkable;

a third step of aligning said lead section of said first board with said electrode of said second board and placing said first board on said second board;

a fourth step of applying a pressure to said first board by means of a pressuring applying jig of an ultraviolet-transmissive material which has an end face acting as a pressuring surface, to connect said lead section of said first board and said electrode of said second board by said applied pressure;

a fifth step of sending rays of ultraviolet to said photosetting adhesive resin via said pressure applying jig and said base member of said first board.

2. The electronic-component manufacturing method according to claim 1, wherein:

said second step is performed after said fourth step;

in said second step said photosetting adhesive resin is applied to around said lead section of said first board and said electrode of said second board which have been connected together with said applied pressure.

3. The electronic-component manufacturing method according to claim 1, wherein:

said first board has a lead section that is already plastic-deformed by application of pressure so as to have uniform height from said base member's surface.

4. The electronic-component manufacturing method according to claim 1, wherein:

in said fourth step at least one side face of said pressure applying jig and a direction of travel of ultraviolet through said pressure applying jig are tilted at almost the same angle with respect to a direction normal to said pressurizing surface of said pressure applying jig.

5. The electronic-component manufacturing method according to claim 1, wherein:

said pressure applying jig used in said fourth step is formed by a bundle of optical fibers;

each said optical fiber has an end face acting as a pressurizing surface.

6. The electronic-component manufacturing method according to claim 5, wherein:

said pressure applying jig used in said fourth step is formed by a bundle of optical fibers each of which has an optical axis that is tilted at a given angle with respect to a direction normal to said pressurizing surface of said pressure applying jig.

7. The electronic-component manufacturing method according to claim 1, wherein:

said lead section of said first board is provided, at a leading end area of said lead section, with at least one groove which runs parallel with a side face of said conductive member.

8. The electronic-component manufacturing method according to claim 7, wherein:

the width of a remaining part of said lead section is greater than the width of said groove in said first board.

9. The electronic-component manufacturing method according to claim 1, wherein:

a first conductive member having a plurality of lead sections is pre-formed;

each said step is executed for connecting each said lead section of said first board and each electrode of said second board.

10. The electronic-component manufacturing method according to claim 1, wherein:

an opening is formed in a location of said platform underneath said electrode and a high-pressure gas tank communicating with said opening is provided;

in said fourth step high-pressure gas is introduced from said high-pressure gas tank into said opening at the time of application of pressure by said pressure applying jig, to apply to said second board a pressure opposing a pressure exerted by said pressure applying jig.

11. The electronic-component manufacturing method according to claim 10, wherein:

an elastic film is provided over said opening of said platform;

in said fourth step a pressure opposing a pressure exerted by said pressure applying jig is applied to said second board by having said elastic film expanded upon introduction of said high-pressure gas.

12. The electronic-component manufacturing method according to claim 3, wherein:

(a) said first board further comprises:

a first adhesive layer provided between said base member and said conductive member;

a second adhesive layer provided between said conductive member and said covering member;

a notch section formed by cutting a part of a side face of said covering member;

(b) in said second step said photosetting adhesive resin is applied to a part, exposed by said notch section, of said first adhesive layer on said first board;

(c) in said fifth step said photosetting adhesive resin attached to said notch section of said covering member is irradiated with ultraviolet rays.

13. The electronic-component manufacturing method according to claim 12, wherein:

in said second step said photosetting adhesive resin, is applied to a wider area including a part of said first adhesive layer exposed at said notch section and a part of said covering member around said exposed first adhesive layer.

14. The electronic-component manufacturing method according to claim 3, wherein:

said fourth step further comprises placing a reinforcing plate on a surface of said first board opposite to said first conductive member of said base member in such a way that said reinforcing plate extends over a part of said notch section and an area next to said notch section covered with a cover film.

15. A method of manufacturing an electronic component wherein:

a first flexible board is pre-formed by placing on a surface of a base member of glass a conductive member in the form of a layer extending along said base member and a covering member in the form of a layer with which a part of said conductive member is covered;

said first board has a body portion formed by laminations of said base portion, said conductive member, and said covering member and a lead section that is an exposed part of said conductive member not covered with said covering member;

said lead section of said first board is connected with an electrode of a second board having thereon a device;

said electronic-component manufacturing method comprising:

a first step of placing said second board on a platform with a surface of said second board carrying thereon said electrode facing upwardly;

a second step of applying to at least one of said first board and said second board a photosetting adhesive resin that is volume-shrinkable;

a third step of aligning said lead section of said conductive member on said first board with said electrode of said second board and placing said first board on said second board;

a fourth step of applying a pressure to said first board by means of a pressure applying jig of an ultraviolet-transmissive material, to connect said lead section of said first board with said electrode of said second board by said applied pressure;

said pressure applying jig having a flat end face acting as a pressuring surface;

at least one of side faces of said pressure applying jig and a direction of travel of ultraviolet rays through said pressure applying Jig being tilted at almost the same angle with respect to a direction normal to said pressurizing surface;

a fifth step of sending rays of ultraviolet to said photosetting adhesive resin via said pressure applying jig and said base member of said first board.

16. The electronic-component manufacturing method according to claim 15, wherein:

said pressure applying jig used in said fourth step is formed by a bundle of optical fibers;

each said optical fiber has an end face acting as a pressurizing surface.

17. The electronic-component manufacturing method according to claim 15, wherein:

an opening is formed in a location of said platform underneath said electrode and a high-pressure gas tank communicating with said opening is provided;

in said fourth step high-pressure gas is introduced from said high-pressure gas tank into said opening at the time of application of pressure by said pressure applying jig, to apply to said second board a pressure opposing a pressure exerted by said pressure applying Jig.

18. The electronic-component manufacturing method according to claim 17, wherein:

an elastic film is provided over said opening of said platform;

in said fourth step a pressure opposing a pressure exerted by said pressure applying jig is applied to said second board by having said elastic film expanded upon introduction of said high-pressure gas.

* * * * *

UNITED STATES PATENT AND TRADEMARK OFFICE
CERTIFICATE OF CORRECTION

PATENT NO. : 5,526,563
DATED : June 18, 1996
INVENTOR(S): Tomohiro Tamaki et al.

It is certified that error appears in the above-identified patent and that said Letters Patent is hereby corrected as shown below:

Col. 6, Line 51: "a" should read --are--.

Figure 14A:
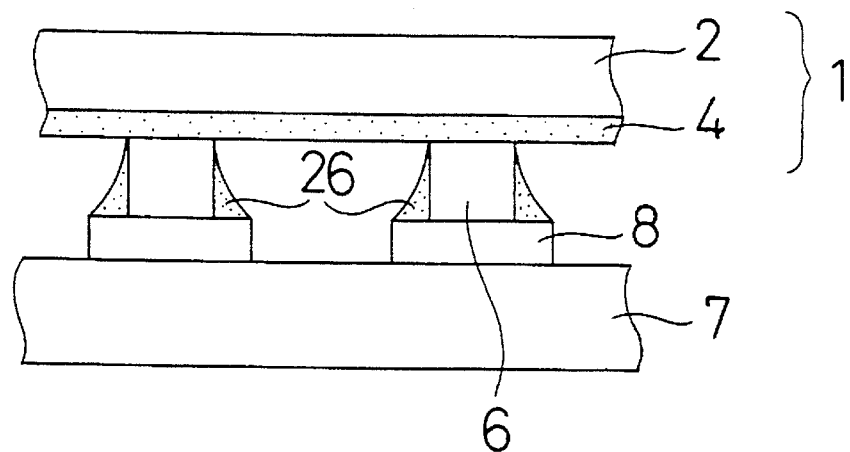
FIG. 14(a) cross-sectionally depicts a conventional connecting technique employing a soldering process.
Figure 14B:
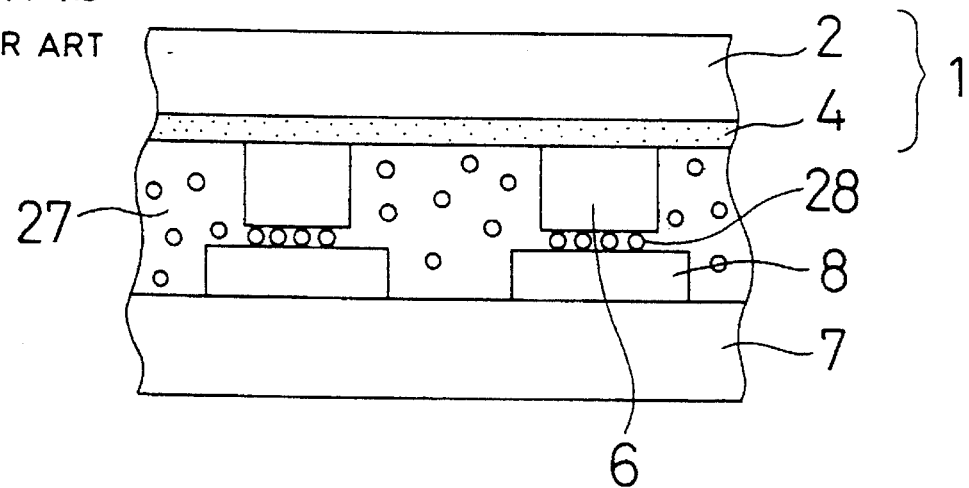
FIG. 14(b) cross-sectionally depicts a conventional connecting technique employing a pressure welding process using an anisotropic conductive sheet.

Col. 7, Lines 1-3: "FIG. 14 cross-sectionally depicts a conventional connecting way employing a soldering process and a pressure welding process using an anisotropic conductive sheet." should be omitted.

Col. 7, Line 56: "tile" should be --the --.

Col. 9, Line 62: "18." should read --13.--.

Signed and Sealed this

Thirtieth Day of June, 1998

BRUCE LEHMAN

*Attest:*

*Attesting Officer*       *Commissioner of Patents and Trademarks*